United States Patent
Gruhlke et al.

(10) Patent No.: US 7,418,016 B2
(45) Date of Patent: Aug. 26, 2008

(54) METHOD AND APPARATUS FOR MODIFYING THE SPREAD OF A LASER BEAM

(75) Inventors: Russell W. Gruhlke, Fort Collins, CO (US); William Richard Trutna, Jr., Atherton, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 296 days.

(21) Appl. No.: 10/366,755

(22) Filed: Feb. 13, 2003

(65) Prior Publication Data

US 2004/0160998 A1    Aug. 19, 2004

(51) Int. Cl.
H01S 3/13    (2006.01)
G02B 5/18    (2006.01)

(52) U.S. Cl. .................................. 372/29.014; 359/558
(58) Field of Classification Search ............ 372/29.014; 359/558, 563; 356/28
See application file for complete search history.

(56) References Cited

U.S. PATENT DOCUMENTS

| | | | |
|---|---|---|---|
| 4,402,574 A * | 9/1983 | McConnel | 359/667 |
| 4,521,772 A | 6/1985 | Lyon | |
| 4,645,302 A | 2/1987 | Aughton | |
| 4,794,384 A | 12/1988 | Jackson | |
| 5,016,149 A | 5/1991 | Tanaka et al. | |
| 5,719,702 A | 2/1998 | Decker | |
| 5,799,119 A | 8/1998 | Rolland | |
| 5,835,514 A * | 11/1998 | Yuen et al. | 372/36 |
| 6,007,218 A * | 12/1999 | German et al. | 362/259 |
| 6,064,786 A | 5/2000 | Cunningham | |
| 6,154,319 A | 11/2000 | Rando et al. | |
| 6,222,174 B1 | 4/2001 | Tullis et al. | |
| 6,236,520 B1 | 5/2001 | Weidel | |
| 6,256,016 B1 | 7/2001 | Piot | |
| 6,264,377 B1 | 7/2001 | Mitsuda | |
| 6,496,621 B1 | 12/2002 | Kathman et al. | |
| 6,530,697 B1 * | 3/2003 | Johnson et al. | 385/88 |
| 6,617,577 B2 * | 9/2003 | Krutchinsky et al. | 250/292 |
| 6,741,335 B2 * | 5/2004 | Kinrot et al. | 356/28 |
| 6,784,441 B2 | 8/2004 | Ahlers | |
| 6,801,354 B1 * | 10/2004 | Payne et al. | 359/291 |
| 6,845,119 B2 | 1/2005 | Deckenbach | |
| 6,856,460 B2 * | 2/2005 | Coleman et al. | 359/565 |
| 2003/0123508 A1 | 7/2003 | Werner et al. | |

(Continued)

FOREIGN PATENT DOCUMENTS

DE    43 35 244 A1    10/1993

(Continued)

OTHER PUBLICATIONS

International Search Reposrt.

(Continued)

Primary Examiner—Minsun Harvey
Assistant Examiner—Phillip Nguyen

(57) ABSTRACT

An apparatus and method for modifying the spread of a laser beam. The apparatus comprises a laser source operable to generate a laser beam having a flux that exceeds a predetermined value and an optical train operable to modify the beam such that the flux of the beam through a predetermined aperture does not exceed the predetermined value. The optical train may include a focusing lens, a diffractive focusing vortex lens, a beam splitting device, or a diffraction grating.

11 Claims, 8 Drawing Sheets

U.S. PATENT DOCUMENTS

| | | |
|---|---|---|
| 2003/0141465 A1* | 7/2003 | Schuda .................. 250/559.29 |
| 2003/0142903 A1* | 7/2003 | Johnson et al. ............... 385/31 |
| 2004/0008414 A1 | 1/2004 | Coleman |
| 2004/0120717 A1* | 6/2004 | Clark et al. ................. 398/118 |
| 2004/0169929 A1 | 9/2004 | Sato et al. |
| 2004/0201893 A1* | 10/2004 | Coleman et al. ............ 359/565 |
| 2004/0201894 A1 | 10/2004 | Brown |

FOREIGN PATENT DOCUMENTS

| | | |
|---|---|---|
| EP | 964 782 B1 | 2/1998 |
| EP | 1 170 707 A2 | 6/2001 |
| EP | 1 279 988 A2 | 7/2002 |
| WO | WO-0013051 | 3/2000 |
| WO | WO 2004/006793 A1 | 7/2002 |

OTHER PUBLICATIONS

English translation of German Office Action dated Feb. 22, 2005; German Patent Application No. 103 53 381.8-51.

International Search Report 2003

* cited by examiner

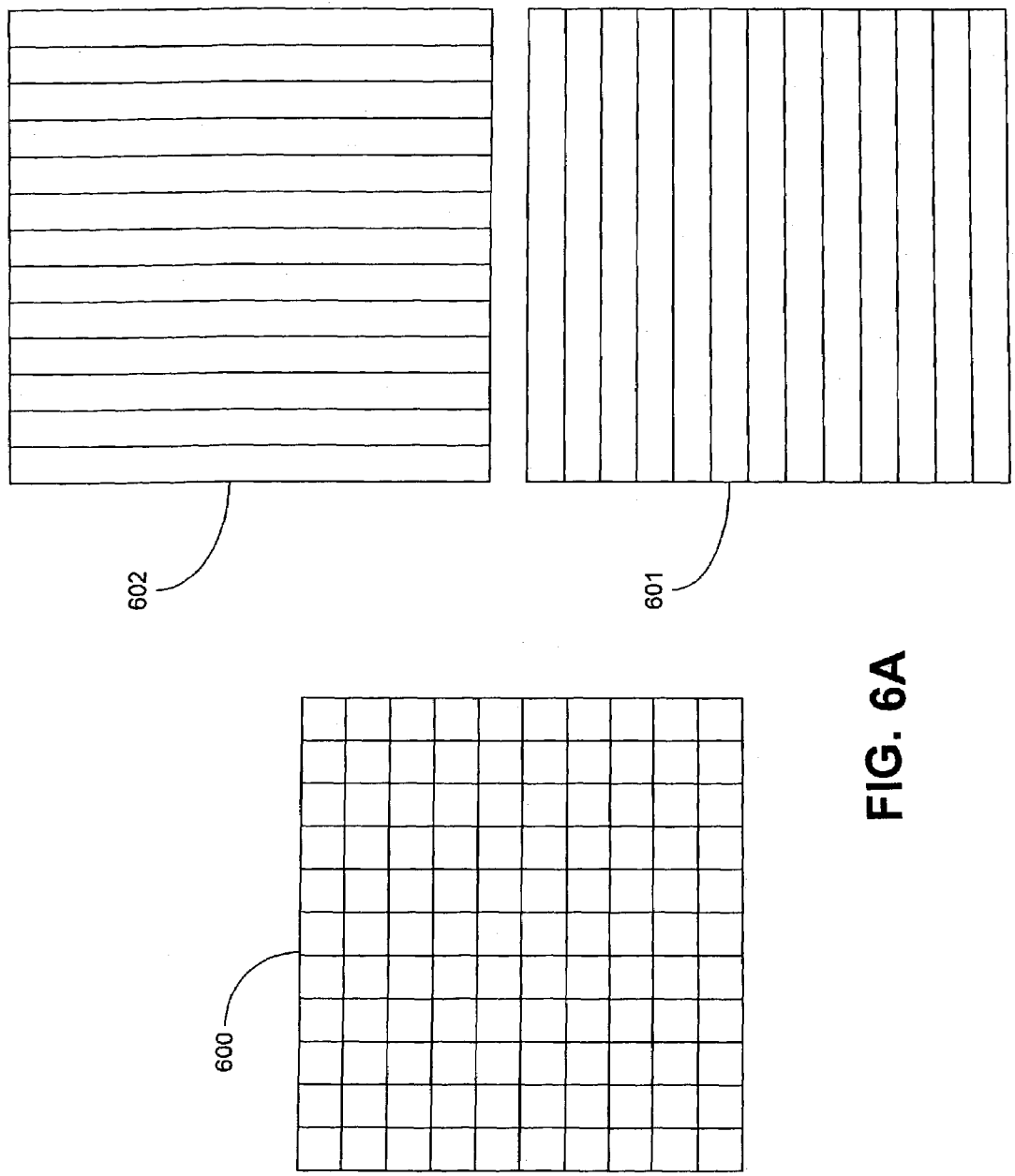

METHOD AND APPARATUS FOR MODIFYING THE SPREAD OF A LASER BEAM

BACKGROUND OF THE INVENTION

Many of today's devices use lasers to implement various functions. For example, an optical mouse or laser pointer use lasers in their respective operations. Additionally, many fiber-optic communication devices use a laser as a source of signal generation.

These lasers generate optical beams that can sometimes generate light powerful enough to damage the human eye. For example, a laser-optic pointing device typically includes a beam-modifying apparatus in optical alignment with the laser designed to focus or collimate the laser beam for its intended use. Therefore, if a person looks into the laser beam, it may cause damage to the unaided eye. And even if the laser beam is not powerful enough to cause eye damage, one may further focus the laser beam with a magnifying lens or other optical instrument such that the further focused beam is capable of causing damage to the eye.

Because products containing laser devices are potentially hazardous to the eye, they are classified accordingly by their potential hazard level. One such classification scheme is the International Standards for The Safety of Laser Products (ISSLP). The least hazardous laser devices, as classified by the ISSLP, are classified as Class 1 laser devices. Laser devices in this category are defined as being safe under reasonably foreseeable—although perhaps not recommended—conditions of use, such as the use of optical instruments such as a magnifying lens for intra-beam viewing. The classification for the next-least-hazardous category of laser devices is Class 1M. This classification covers laser devices that are safe under reasonably foreseeable conditions of operation, but may be hazardous if the user employs an optical instrument such as a magnifying lens for intra-beam viewing.

According to the ISSLP, the maximum-allowed power, i.e., acceptable emission light (AEL) level, for a commonly used single-mode 850 nanometer (nm) wavelength Class 1 laser device is 0.78 milliwatts (mW) when measured according to the ISSLP-defined standard. The defined standard is the amount of flux (power per unit area) through a 7 millimeter (mm) aperture in a radial plane that is 14 mm from the point where the laser beam exits the device. Thus, if the flux of the laser beam that passes through the 7 mm aperture is less than 0.78 mW, then the laser device is considered Class 1 safe.

A speckle-based motion sensor, which could be used in an optical mouse, is a device that uses a laser for its functionality. In a speckle-based motion sensor, a laser beam is directed to a surface and the reflection of the laser beam from the surface creates a complex diffraction pattern, called a speckle pattern. If the laser beam moves relative to the surface, then the speckle pattern changes. Detectors for receiving the reflected speckle pattern can then determine the relative changes in the speckle pattern and translate these changes into the relative lateral motion of the laser-beam source. For acceptable performance, however, a laser in a speckle-based motion sensor is typically operated at power levels that exceed the maximum-allowable AEL for a Class 1 rating. That is, if the power is reduced to meet the Class 1 requirements, the speckle-based motion sensor may not perform at an acceptable level.

SUMMARY OF THE INVENTION

An embodiment of the invention comprises a laser source operable to generate a laser beam having a flux that exceeds a predetermined value and an optical train operable to modify the beam such that the flux of the beam through a predetermined aperture does not exceed the predetermined value. The optical train may include a focusing lens, a diffractive focusing vortex lens, a beam splitting device, or a diffraction grating.

By diverging or diffracting some of the flux in the laser beam, a more powerful laser may be used, and yet the device incorporating the laser can still receive a Class 1 rating. Such an apparatus and method may be used in devices that require a more powerful laser but still need a Class 1 rating, such as an optical mouse using speckle motion detection.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 6A is a top view of a two-dimensional diffractive grating for use in the apparatus of FIG. 1 according to an embodiment of the invention;

DETAILED DESCRIPTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
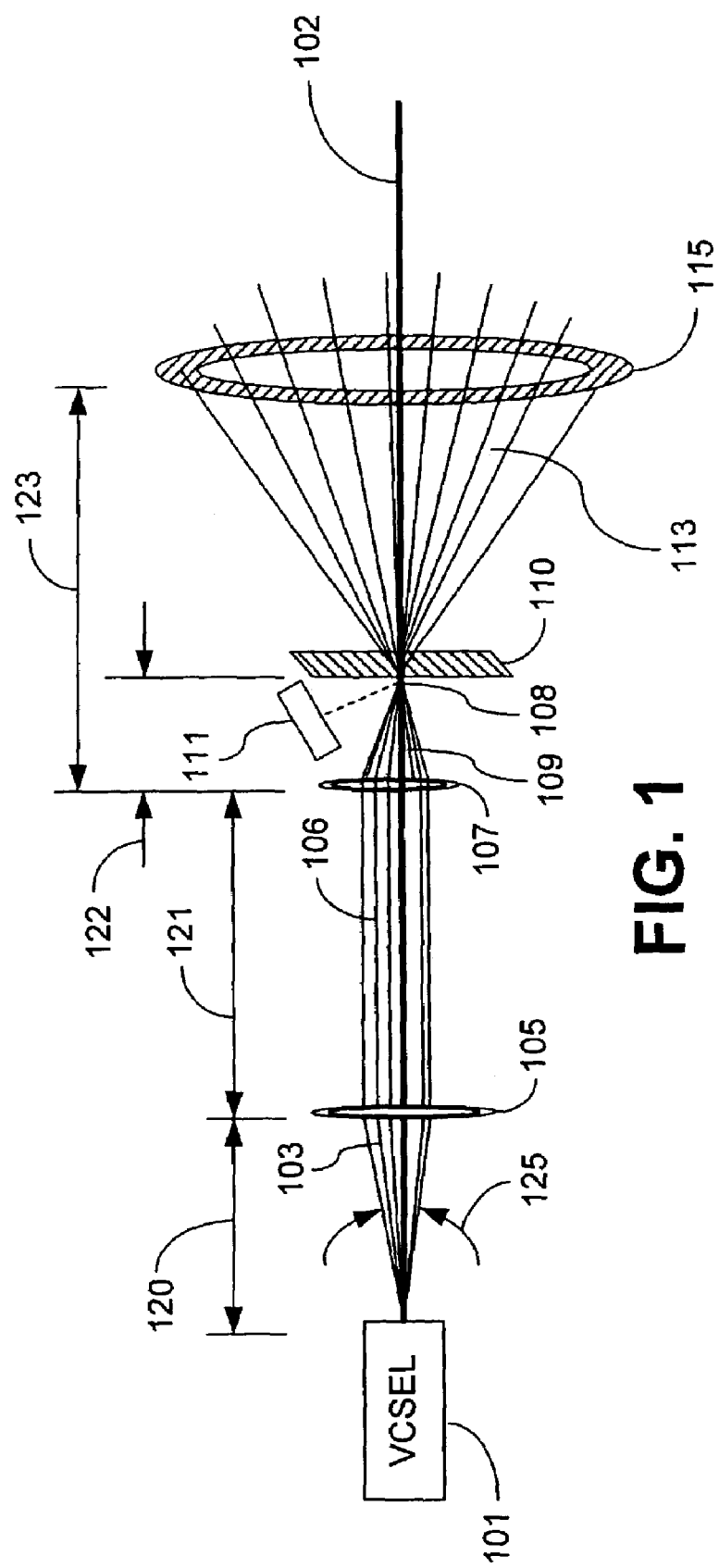
FIG. 1 is a diagram of a laser-beam modifying apparatus that uses a focusing lens according to an embodiment of the invention.

FIG. 1 is a diagram of an apparatus for modifying a laser beam for use in an optical mouse according an embodiment of the invention. In this embodiment, a Vertical Cavity Surface Emitting Laser (VCSEL) 101 emits an 850 nm wavelength laser beam along an optical axis 102. A typical VCSEL 101 will have an associated divergence angle 125 which is a measure of the widest angle at which individual rays of the laser beam emanate from the VCSEL 101. Typically, the divergence angle 125 is defined as the angle at which the optical intensity (power per unit area) of the laser beam falls to one-half of the peak, on-axis value. A typical laser beam may have a divergence angle 125 of up to about 20. That is, individual rays of the laser beam emanate in a divergent, omni-directional manner at an angle of up to 10 from the optical axis 102. For the purposes of laser eye safety, however, a worst case scenario is taken into account where the divergence angle 125 is 12.

The optical axis 102 of the VCSEL 101 is aligned with a collimating lens 105 located at a distance 120 of approximately 1.5 mm from the VCSEL 101. The collimating lens 105 refracts the diverging laser beam 103 to produce a collimated laser beam 106 that is aligned with the optical axis 102. Given a 12 divergence angle 125 before the diverging laser beam 103 enters the collimating lens 105, the diameter of the collimated laser beam 106 is approximately 0.62 mm. Thus, without further conditioning, the entire collimated laser beam 106 would easily pass through a test aperture 115. The power emitted by the VCSEL 101 is, therefore, limited to the 0.78 mW AEL, which may not produce an adequate signal level for a speckle-based motion sensing. Therefore, the collimated laser beam 106 is passed through another beam modifying medium 107, such as a lens, prism, or grating according to various embodiments of the invention as discussed below.

In the embodiment shown in FIG. 1, the beam-modifying medium 107 is a refractive focusing lens 107. The collimated laser beam 106 is passed through the focusing lens 107, which is at a distance 121 of approximately 1 mm away from the collimating lens 105 along the optical axis 102. This distance 121 is typically equal to thickness of an optical substrate (not shown) used to hold the lenses 105 and 107 in position. The focusing lens 107 focuses the collimated laser beam 106 to converge at a point 108, which is at a distance 122 of approximately 1 mm away from the focusing lens 107 along the optical axis 102. If the converging laser beam 109 were to strike an object, such as the target 110, the reflection would produce a speckle pattern, and a detector 111 can detect motion of the beam 109 relative to the target 110 by detecting changes in the speckle pattern. Since an optical mouse (not shown in FIG. 1) is typically placed on a mouse pad or other flat surface, the mouse pad or surface functions as a suitable target 110 and changes in the reflected speckle pattern, and thus movement of the mouse, may be detected by the detector 111 within the mouse.

If the target 110 is removed, i.e., the optical mouse pointing device is lifted away from the reflecting surface, then the convergent laser beam 109 will propagate past the focal point 108 and then proceed to diverge. If one were to measure the flux of the now diverging laser beam 113 through any 7 mm aperture at a radial distance 123 of 14 mm from the focusing lens 107 (which in one embodiment is the closest point of human access as defined by the ISSPL for determining the AEL level for the laser eye-safety standard), one would find that only a portion of the diverging laser beam 113 would pass through the aperture 115. As discussed below, the maximum flux passes through the aperture 115, which has its center aligned with the axis 102, and this maximum flux is low enough to meet the requirements for a Class 1 rating. Furthermore, the ISSPL requires that the radial distance 123 be measured from the point where the beam 109 exits the device that generates the beam; thus, the distance 123 may be measured from other than the lens 107 in other embodiments.

In the embodiment shown in FIG. 1, only about 25% of the diverging laser beam 113 passes through the aperture 115. As discussed above, even if the aperture 115 is moved to different angles with respect to the optical axis 102 (which is akin to looking at the focusing lens 107 from different angles), 25% of the divergent laser beam 113 will typically be the maximum amount to pass through the aperture 115. Thus, in this particular example, the AEL level of the VCSEL 101 could be as high as 3.0 mW yet still only produce a flux of 0.75 mW (which is below the maximum flux allowed for a Class 1 rating) through the 7 mm aperture 115.

Other embodiments are contemplated wherein the modifying medium may be different. For example, instead of using a focusing lens 107, as is the case in the embodiment of FIG. 1, the modifying medium 107 may be a diffractive focusing vortex lens (not shown in FIG. 1).

Figure 2:
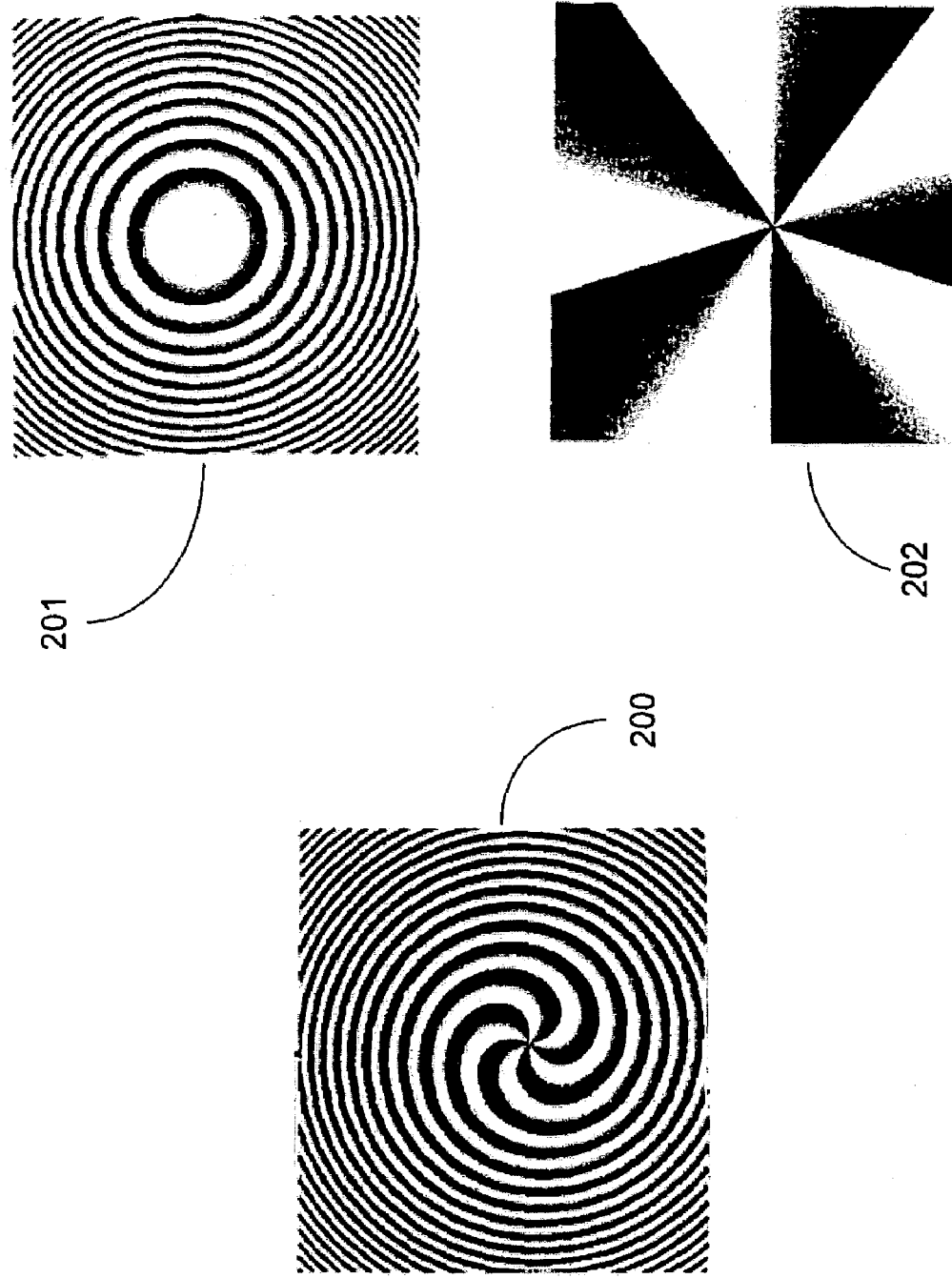
FIG. 2 is a top view of a diffractive focusing vortex lens for use in the apparatus of FIG. 1 according to an embodiment of the invention.

FIG. 2 shows a top view of a diffractive focusing vortex lens 200 according to an embodiment of the invention. There are several well-known ways of creating diffractive light using a diffractive focusing vortex lens 200. The diffractive focusing vortex lens 200 is created by superimposing a concentric-edge microstructure lens 201 with a radial-edge microstructure lens 202. The resulting effect to light, i.e., the collimated laser beam 106, passed through the superimposed lenses 201 and 202 causes light to "twist" away from diffractive focusing vortex lens 200 along the optical axis 102.

Figure 3:
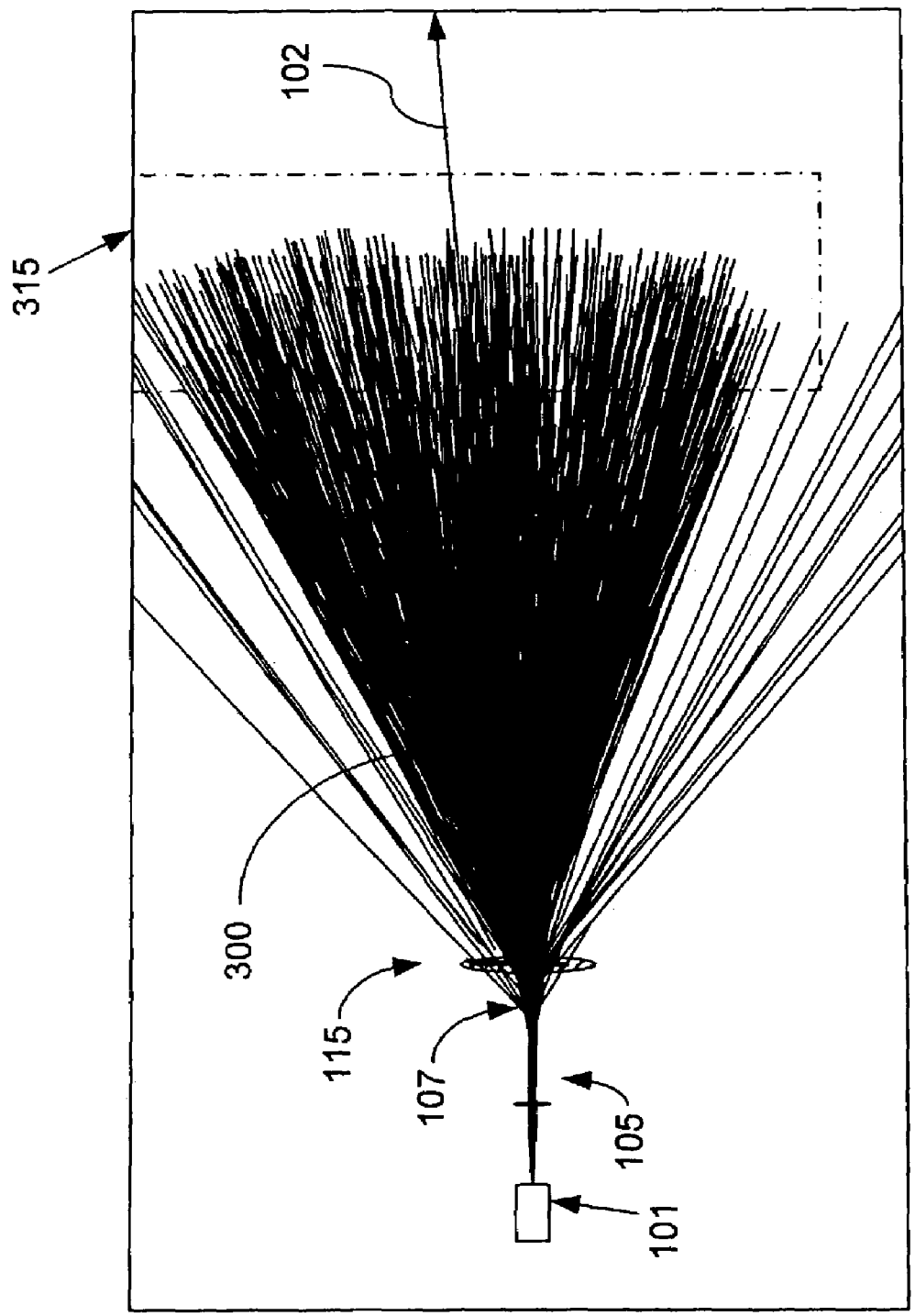
FIG. 3 is an orthogonal view of a ring-shaped irradiance distribution pattern that results from modifying a laser beam with the diffractive focusing vortex lens of FIG. 2 according to an embodiment of the invention.

Referring to FIG. 3, the twisting nature of light passed through the diffractive focusing vortex lens 200 results in the formation of a donut- or ring-shaped irradiance distribution pattern 300 in the plane 315 orthogonal to the optical axis 102. That is, this phenomenon causes the pattern 300 to appear as a hollow "cone" when looking into the axis 102 toward the modifying medium 107 (which here is the lens 200). If designed properly, i.e., designed with the Class 1 rating in mind, the diameter of the "cone" of the ring-shaped irradiance distribution pattern 300 at the 14 mm point that corresponds to the aperture 115 position will be slightly larger than the aperture 115 diameter of 7 mm. Thus, if the aperture 115 is centered on the optical axis 102, little or no laser light passes through it.

A person, however, may not always choose to look directly into the optical axis 102. As such, portions of the ring-shaped irradiance distribution pattern 300 may enter the eye. Depending on the angle (measured as displacement from the optical axis 102) one is looking, the amount of flux will also vary.

Figure 4:
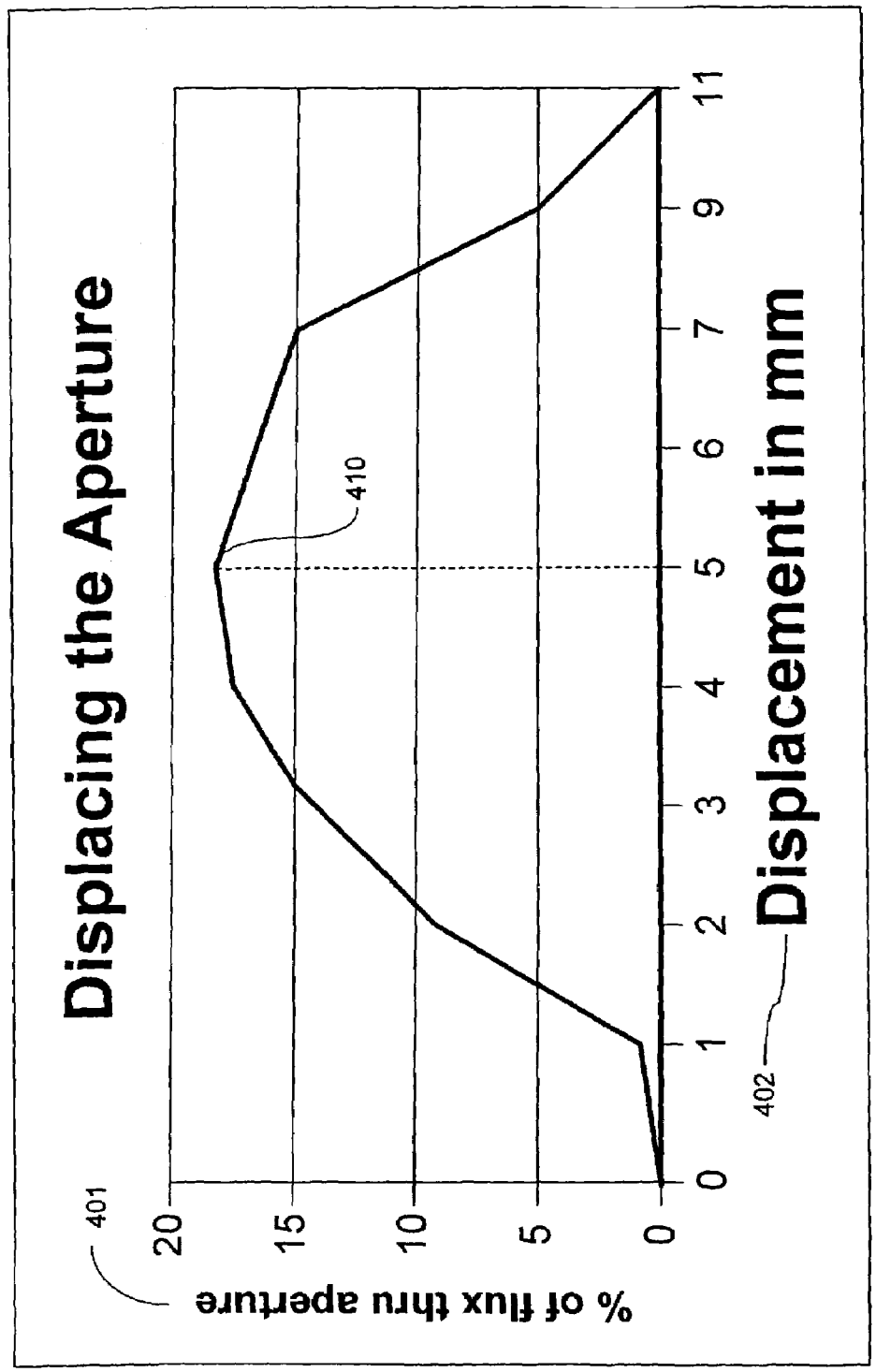
FIG. 4 is a graph of the percent of flux with respect to the displacement of the aperture that passes though the aperture when using the diffractive focusing vortex lens of FIG. 2 according to a embodiment of the invention.

FIG. 4 is a graph that plots the percent 401 of flux passing through the aperture 115 as a function of the displacement 402 in millimeters radial from the optical axis 102. A worst case scenario point 410 occurs when the aperture 115 is displaced 5 mm in a direction perpendicular to the optical axis 102. However, the maximum flux passing through the aperture at any given point is 20%. Thus, to receive a Class 1 rating, a VCSEL 101 may have an AEL level of up to 4 mW.

Figure 5:
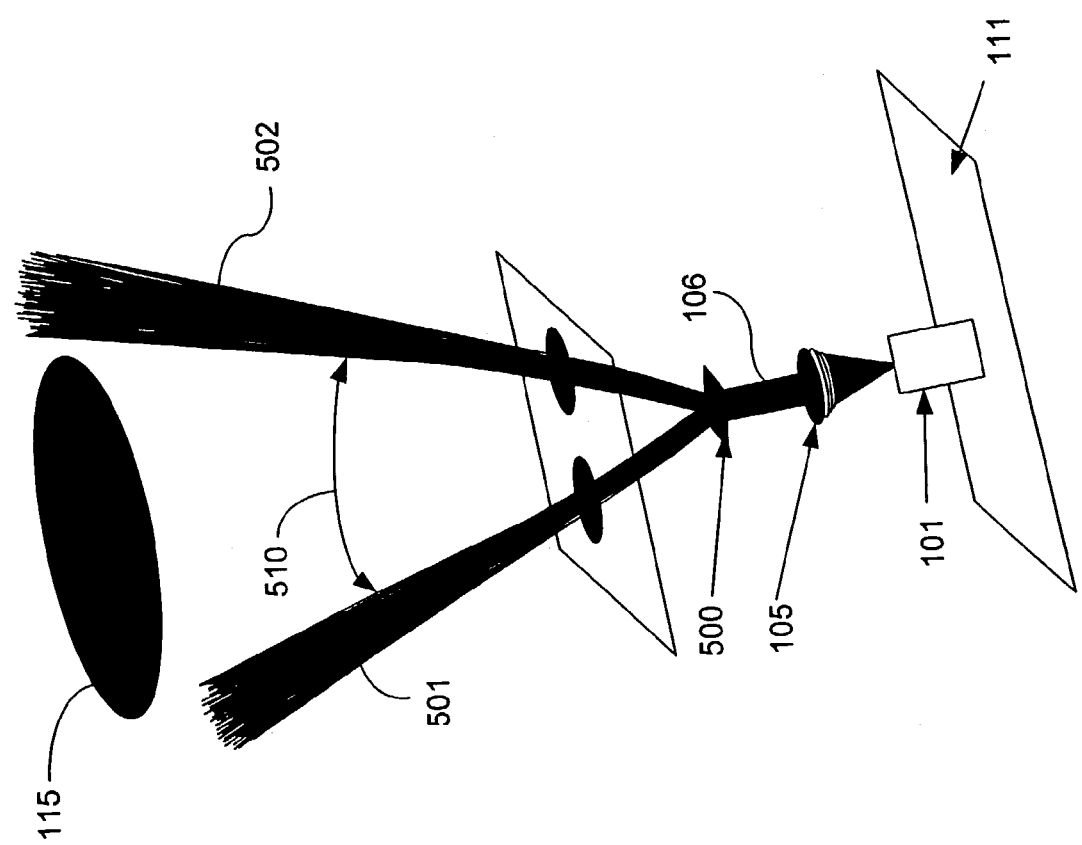
FIG. 5 is a diagram of a laser-beam modifying apparatus that uses a beam splitting device according to an embodiment of the invention.

In another embodiment shown in FIG. 5, the modifying medium is a beam-splitting element 500. The beam-splitting element 500, which may include one or more prisms, is employed to reduce the amount of flux that passes through the 7 mm aperture 115 for any given viewing angle by refracting portions of the laser beam in different directions. When the collimated laser beam 106 enters the beam splitting element 500, the collimated laser beam 106 is split into a first beam 501 and a second beam 502. With an appropriate design in this embodiment, the two beam 501 and 502 diverge at an angle 510 large enough so that at most only one beam 501 or 502 passes through the 7 mm aperture 14 mm away at any given viewing angle. Thus, the minimum angle 510 between any two beams 501 and 502 is approximately 24.2 degrees. This effectively doubles the AEL level allowed for the VCSEL 101 beam 106 to still be within the Class 1 rating.

In another embodiment, the beam-splitting element 500 may split the collimated laser beam 106 into more than two beams. If the collimated laser beam 106 is split into n separate beams, the maximum allowable AEL level of the beam 106 will be 0.78 mW×n. This assumes that no more than one of the n beams passes through any 7 mm aperture at a radial distance of 14 mm. In the example shown in FIG. 5, the maximum AEL level of the beam 106 is calculated to be equal to 2×0.78 mW=1.56 mW maximum VCSEL power. Other possible beam splitting devices 500 include conventional diffractive and holographic elements or multiple refractive lenses.

In yet another embodiment, the modifying medium 107 may be a diffraction grating 600 as shown in FIG. 6A. The diffraction grating 600 is a two-dimensional diffraction element that includes a double exposure of its photo-resist layer coating on a glass substrate, an x-direction exposure 601 and a y-direction exposure 602. A well-known holographic exposure method in which two collimated UV laser beams impinge on the photo-resist surface at a known angle is used to create the two-dimensional diffraction grating 600. In this method, the interference of the two equal-power collimated ultraviolet (UV) laser beams creates a sinusoidal intensity pattern whose period depends on the angle between the beams. The greater the angle, the smaller the period. The first exposure 601 creates a latent image of a sinusoidal phase grating along the x-direction, wherein the sine wave is with respect to the depth of the cut. After rotating the substrate by 90 degrees, a second exposure 602 creates a grating along the y-direction (also sinusoidal with respect to the depth of the cut). The final result is the two-dimensional diffraction grating 600 wherein the photo-resist layer pattern is a surface relief grating with a nearly sinusoidal groove shape in both x and y directions. [MSOffice1]

Figure 6B:
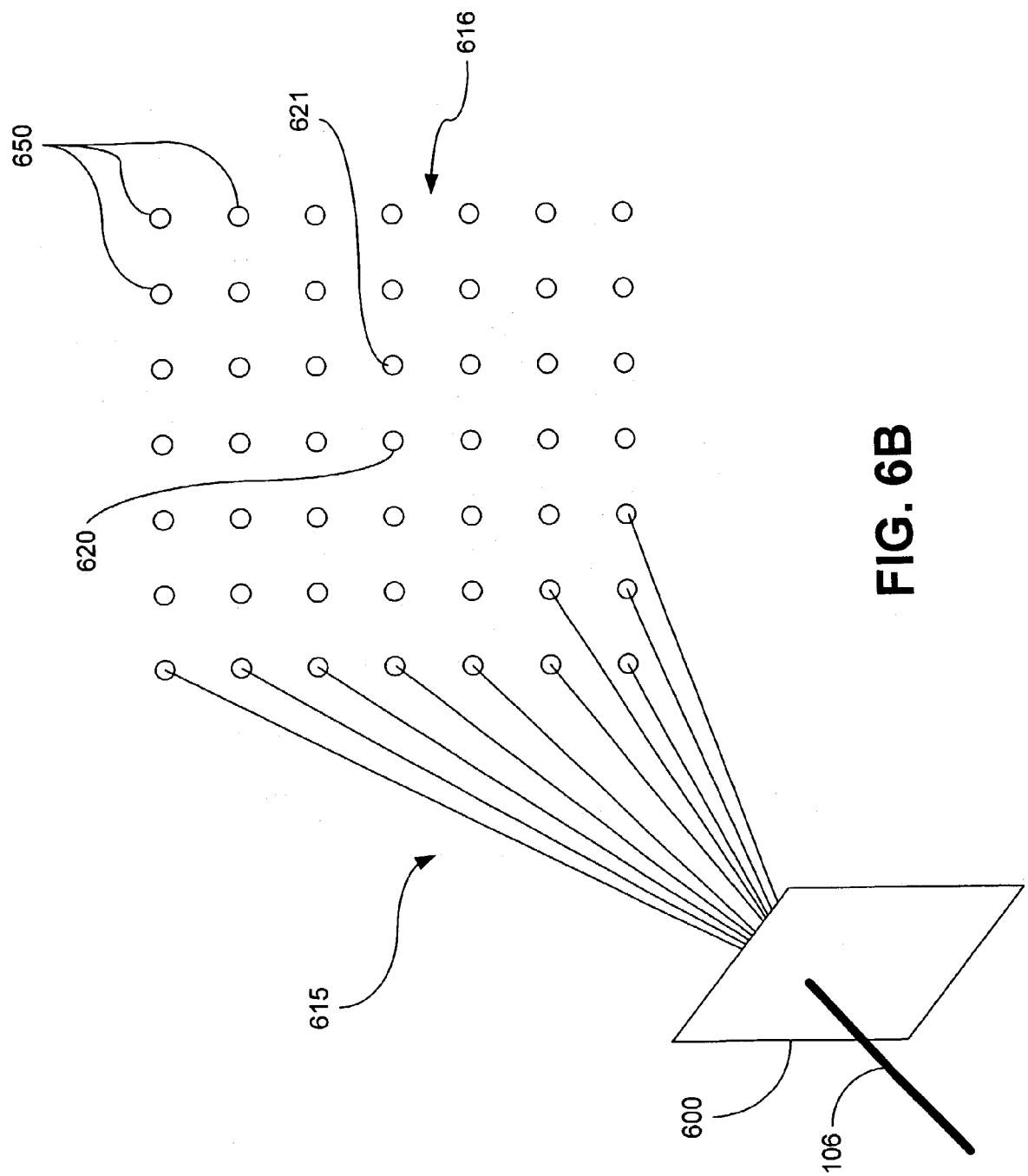
FIG. 6B is a plot of an array of divergent laser beams that result from a laser beam that passes through the two-dimensional diffractive grating of FIG. 6B according to an embodiment of the invention.

Referring to FIG. 6B, when the collimated laser beam 106 passes through such a two-dimensional diffraction grating 600, the collimated laser beam 106 is diffracted into an array of divergent laser beams 615 which emanate from the two-dimensional diffraction grating 600 at various angles. If the divergent laser beams 615 were to be displayed on a distant wall for viewing, an array of light spots 616 would be seen. For the purposes of this discussion, the spots 616 are labeled in a simple x-y axis beginning with the center spot 620 at (0, 0). The spot from the first divergent laser beam 621 to the right is (1, 0), and so on. As the distance between the display wall and the laser source becomes larger, the distance between spots also becomes larger.

The angles between the divergent laser beams 615 are determined by the period of the two-dimensional diffraction grating 600. The angular separation is approximately $\lambda/\Lambda_x$ for the x-direction, where $\Lambda_x$ is the period of the x-grating 601 and λ is the laser wavelength. There is an identical expression for the diffraction angle for the y-grating 602.

In one example, if Λ is 15 microns and the wavelength of the collimated laser beam 106 is 850 nm, then the angle between grating orders is about 56.7 milliradians or about 3.25 degrees. FIG. 6B shows a diffraction pattern for equal x-grating 601 and y-grating 602 periods (FIG. 6A). The flux in the higher orders 650 decreases gradually with grating order and the higher orders 650 extend to nearly 90 degrees from the normal of the two-dimensional diffraction grating 600. The fractional power diffracted into the (p,q) order can be shown (*Introduction to Fourier Optics*, J. W. Goodman, McGraw Hill, 1968) to be:

$$J_q^2\left(\frac{m}{2}\right)J_p^2\left(\frac{m}{2}\right)$$

where J is the Bessel function of the first kind, the order is p or q, and m is the peak-to-peak phase delay of the two-dimensional diffraction grating 600, which is proportional to groove depth. In this embodiment, the x-grating 601 and the y grating 602 groove depths are the same, but in other embodiments, they may be different. If m=8 radians, then the maximum flux in the zero order laser beam 620 is about 2.5% of the flux of the collimated laser beam 106. The flux in orders (0,1), (1,0), (0, –1), and (–1,0) 621 is about 0.07% of the flux of the collimated laser beam 106. In orders (1,1), (1, –1), (–1,1), and (–1, –1) the flux is about 0.0019% of the flux of the collimated laser beam 106. The deep grooves spread the flux into many higher order 650 laser beams. If the two-dimensional diffraction grating 600 is made shallower, i.e., reducing m, then the flux in the lower orders will rise. For example, reducing m to 2 increases the flux in the zero-order laser beam 620 to 34% of the collimated laser beam 106 beam.

An advantage of using a two-dimensional diffraction grating 600 as the modifying medium 107 in the system of FIG. 1 is that by designing the spatial frequency, wherein the angle between diverging laser beams 615 is high enough, typically only one of the diffraction orders can pass through the 7 mm aperture 115. Therefore, for a 7 mm aperture 115 which is 14 mm away from two-dimensional diffraction grating 600, the angle between divergent laser beams 615 is typically greater than about 24.2 degrees. Even if the angle between the divergent laser beams 615 is less than 24.2 degrees, so that multiple divergent laser beams 615 may enter the 7 mm aperture 115, the divergent laser beams 615 will still not cause damage to the human eye. The reason for this is that the divergent laser beams 615 will not focus to a single spot on the retina, but rather an array of spots 616. Since eye damage is typically caused by localized heating of the retina, spreading the light into an array of spots 616 reduces the possibility of damage to the eye, thus increases the maximum allowable AEL level for a VCSEL 101.

Because only one divergent laser beam 615 will pass through the aperture 115 at any one angle of incidence, only the strongest divergent laser beam 615 (the zero-order laser beam 620 (0,0)) needs to be taken into consideration for the eye-safety standard since all other divergent laser beams 615 have a lower magnitude. As such, for a grating modulation of m=8, the flux of the undiffracted laser beam 620 is about 2.5% of the flux of the collimated laser beam 106 as discussed above. Therefore, an acceptable AEL level for a VCSEL 101 in this embodiment may be 40 times the Class 1 rating. Even if m=2, the AEL level for a VCSEL 101 may be about 3 times the Class 1 rating.

Figure 7:
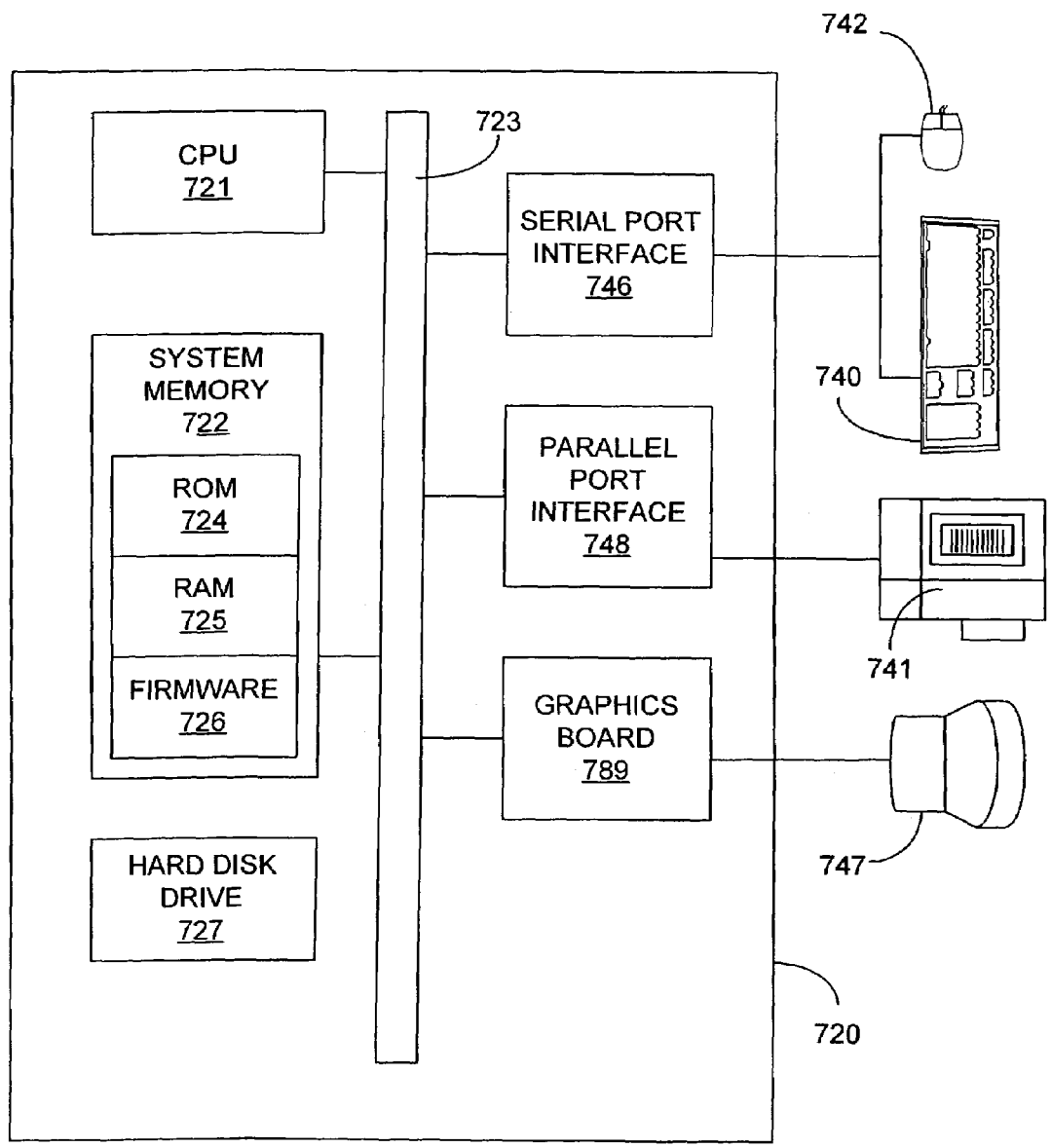
FIG. 7 is a block diagram of an electronic system that incorporates the apparatus of FIG. 1 according to an embodiment of the invention.

FIG. 7 is a block diagram of a general-purpose computer system 720 that includes an optical mouse 742 that incorporates the apparatus of FIG. 1 according to an embodiment of the invention. The computer system 720 (e.g., personal or server) includes one or more processing units 721, system memory 722, and a system bus 723. The system bus 723 couples the various system components including the system memory 722 to the processing unit 721. The system bus 723 may be any of several types of busses including a memory bus, a peripheral bus, and a local bus using any of a variety of bus architectures. The system memory 722 typically includes read-only memory (ROM) 724 and random-access memory (RAM) 725. Firmware 726 containing the basic routines that help to transfer information between elements within the computer system 720 is also contained within the system memory 722. The computer system 720 may further include a hard disk-drive system 727 that is also connected to the system bus 723. Additionally, optical drives (not shown), CD-ROM drives (not shown), floppy drives (not shown) may be connected to the system bus 723 through respective drive controllers (not shown) as well.

A user may enter commands and information into the computer system 720 through input devices such as a keyboard 740 and an optical mouse 742. These input devices as well as others not shown are typically connected to the system bus 723 through a serial port interface 746. Other interfaces (not shown) include Universal Serial Bus (USB) and parallel ports 740. A monitor 747 or other type of display device may also be connected to the system bus 723 via an interface such as the graphics card 789.

We claim:

1. An apparatus, comprising:
   a laser source operable to generate a laser beam having a flux that exceeds a predetermined value, the predetermined value associated with a class rating; and
   an optical train operable to modify the beam such that the flux of a portion of the beam that propagates through a predetermined aperture does not exceed the predetermined value, the optical train comprising a diffractive focusing vortex lens operable to diffract the laser beam into a ring-shaped irradiance distribution pattern.

2. The apparatus of claim 1 wherein the laser source comprises a vertical cavity emitting laser.

3. The apparatus of claim 1 wherein the predetermined value equals 0.78 milliwatts.

4. The apparatus of claim 1, further comprising:
   a housing in which the laser source and optical train are disposed, the housing having a window through which the modified laser beam propagates; and
   wherein the predetermined aperture has a diameter of 7 mm and is located a radial distance of 14 mm from the window.

5. The apparatus of claim 1 wherein the optical train further comprises a collimating lens operable to collimate the laser beam.

6. The apparatus of claim 1 wherein the diffractive focusing vortex lens comprises a concentric edge microstructure lens superimposed on a radial edge microstructure lens.

7. The apparatus of claim 1 wherein the ring-shaped irradiance distribution pall em has a diameter of greater than the predetermined aperture.

8. The apparatus of claim 1 wherein the aperture is disposed in a radial plane that is at an angle of incidence orthogonal to the optical axis of the laser beam.

9. A method, comprising:
   generating a laser beam having a flux that exceeds a predetermined value, the predetermined value associated with a laser class rating; and
   modifying the beam such that the flux of a portion of the beam that propagates through a predetermined aperture does not exceed the predetermined value, wherein said modifying the beam comprises diffracting the beam into a ring-shaped irradiance pattern such that no portion of the ring-shaped irradiance pattern that intersects the predetermined aperture has a resultant flux that exceeds the predetermined value.

10. A method, comprising:
    generating a laser beam having a flux that exceeds a predetermined value, the predetermined value associated with a laser class rating; and
    modifying the beam such that the flux of a portion of the beam that propagates through a predetermined aperture does not exceed the predetermined value, wherein said modifying the beam comprises splitting the beam into at least two beams such only one beam intersects the predetermined aperture.

11. A method, comprising:
    generating a laser beam having a flux that exceeds a predetermined value, the predetermined value associated with a laser class rating; and
    modifying the beam such that the flux of a portion of the beam that propagates through a predetermined aperture does not exceed the predetermined value, wherein said modifying the beam comprises diffracting the beam into an array of beams such that no set of beams that intersect the predetermined aperture have a resultant flux that exceeds the predetermined value.

* * * * *